United States Patent

Mertol

[19]

[11] Patent Number: 6,008,536
[45] Date of Patent: Dec. 28, 1999

[54] GRID ARRAY DEVICE PACKAGE INCLUDING ADVANCED HEAT TRANSFER MECHANISMS

[75] Inventor: Atila Mertol, Cupertino, Calif.

[73] Assignee: LSI Logic Corporation, Milpitas, Calif.

[21] Appl. No.: 08/880,784

[22] Filed: Jun. 23, 1997

[51] Int. Cl.[6] .................................................. H01L 23/34
[52] U.S. Cl. ........................ 257/704; 257/712; 257/713
[58] Field of Search .................................. 257/704, 712, 257/713, 718, 701, 702

[56] References Cited

U.S. PATENT DOCUMENTS

| 5,296,739 | 3/1994 | Heilbronner et al. | 257/718 |
| 5,579,212 | 11/1996 | Albano et al. | 257/704 |
| 5,717,248 | 2/1998 | Neumann et al. | 257/718 |

FOREIGN PATENT DOCUMENTS

| 4-97554 | 3/1992 | Japan | 257/718 |

*Primary Examiner*—Peter Toby Brown
*Assistant Examiner*—Roy Potter

[57] ABSTRACT

A system and method are presented for forming a grid array device package around an integrated circuit (i.e., chip). The device package includes a substrate and a heat spreader. The chip includes multiple I/O pads preferably arranged in a two-dimensional array on an underside surface. The substrate includes a first set of bonding pads on an upper surface configured to vertically align with the I/O pads. The chip is connected to the first set of bonding pads using the C4 method. The substrate maintains its substantially planar shape during C4 heating. The heat spreader is thermally conductive and preferably dimensioned to substantially cover the upper surface of the substrate. An underside surface of the heat spreader includes a cavity dimensioned to receive the chip and multiple pins extending outwardly therefrom. The substrate includes multiple holes adapted to receive the pins of the heat spreader. Following the C4 mounting of the chip upon the substrate, the heat spreader is attached to the upper surface of the substrate such that the pins of the heat spreader extend into the holes of the substrate and the chip resides within the heat spreader cavity. The ends of the heat spreader pins are connected to at least one member of a second set of bonding pads on the underside surface of the substrate, providing additional thermal paths for the dissipation of heat energy produced by the chip during operation.

16 Claims, 3 Drawing Sheets

GRID ARRAY DEVICE PACKAGE INCLUDING ADVANCED HEAT TRANSFER MECHANISMS

BACKGROUND OF THE INVENTION

1. Field of Invention

This invention relates to semiconductor device packages, and more particularly to grid array packages using the controlled collapse chip connection (C4) method to attach an integrated circuit (i.e., a chip) to a substrate.

2. Description of Related Art

During manufacture of an integrated circuit (e.g., a microprocessor), signal lines formed upon the silicon substrate which are to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device packages are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Controlled collapse chip connection (C4) is a well known method of attaching an integrated circuit chip directly to a PCB, and is commonly referred to as the "flip chip" method. In preparation for C4 attachment, the I/O pads of the chip are typically arranged in a two-dimensional array upon an underside of the chip, and a corresponding set of bonding pads are formed upon an upper surface of the PCB. A solder "bump" is formed upon each of the I/O pads of the chip. During C4 attachment of the chip to the PCB, the solder bumps are placed in physical contact with the bonding pads of the PCB. The solder bumps are then heated long enough for the solder to flow. When the solder cools, the I/O pads of the chip are electrically and mechanically coupled to the bonding pads of the PCB. After the chip is attached to the PCB, the region between the chip and the PCB is filled with an "underfill" material which encapsulates the C4 connections and provides other mechanical advantages.

Like flip chips, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array (BGA) device package. A BGA device includes a chip mounted upon a larger substrate made of, for example, fiberglass-epoxy printed circuit board material or a ceramic material (e.g., aluminum oxide, alumina, $Al_2O_3$, or aluminum nitride, AlN). The substrate includes two sets of bonding pads: a first set adjacent to the chip and a second set arranged in a two-dimensional array across the underside surface of the device package. Members of the second set of bonding pads function as device package terminals, and are coated with solder. The resulting solder balls on the underside of the BGA device package allow the device to be surface mounted to an ordinary PCB. The I/O pads of the chip are typically connected to corresponding members of the first set of bonding pads by signal lines (e.g., fine metal wires). The substrate includes one or more layers of signal lines (i.e., interconnects) which connect respective members of the first and second sets of bonding pads. During PCB assembly, the BGA device package is attached to the PCB by reflow of the solder balls just as a flip chip is attached to a PCB.

Semiconductor devices (e.g., integrated circuit chips) dissipate electrical power during operation, transforming electrical energy into heat energy. At the same time, several key operating parameters of a semiconductor device typically vary with temperature, and reliable device operation within specifications occurs only within a defined operating temperature range. For high performance devices, such as microprocessors, specified performance is only achieved when the temperature of the device is below a specified maximum operating temperature. Operation of the device at a temperature above an upper limit of the operating temperature range, or above the maximum operating temperature, may result in irreversible damage to the device. In addition, it has been established that the reliability of a semiconductor device decreases with increasing operating temperature. The heat energy produced by a semiconductor device during operation must thus be removed to the ambient environment at a rate which ensures operational and reliability requirements are met.

The operating temperature of an integrated circuit chip enclosed within a semiconductor device package is governed by: (i) the temperature of the ambient surrounding the device package, (ii) the amount of electrical power dissipated by the chip, and (iii) the sum of thermal resistances of elements and interfaces along a heat transfer path from the chip to the ambient. More complex heat transfer (i.e., cooling) mechanisms, such as heat sinks and forced air cooling, permit semiconductor devices to dissipate more electrical power than direct exposure to the ambient would otherwise allow.

It would be beneficial to have a packaged integrated circuit device including an integrated circuit chip enclosed within a semiconductor device package, wherein the device package includes grid array terminals, and wherein the chip is mounted upon a substrate of the device package using the C4 or flip chip attachment method. The use of C4 attachment would reduce many of the problems associated with using fine metal wires to connect the I/O pads of the chip to corresponding bonding pads of the BGA package, including wire crossover problems and the added electrical inductances of the wires. The use of C4 attachment would also reduce the required dimensions of a cavity within the device package provided to contain the chip, thereby allowing the outer dimensions of the desired device package to be reduced. Due to size reduction, the weight of the desired packaged integrated circuit device would be reduced as well. Such a small and light packaged integrated circuit device would be especially desirable for portable applications. The relatively small packaged integrated circuit device would necessarily employ sophisticated heat transfer mechanisms in order to remove the heat energy generated by the chip during operation.

SUMMARY OF THE INVENTION

The problems outlined above are in large part solved by a system and method for forming a grid array device package around an integrated circuit. The device package includes a substrate and a heat spreader. The integrated circuit (i.e., chip) is mounted upon the substrate using the controlled collapse chip connection (C4) or "flip chip" method described above. The heat spreader includes a cavity in an underside surface and multiple pins extending outwardly form the underside surface. The cavity is dimensioned to receive the integrated circuit. The substrate includes multiple holes adapted to receive the pins of the heat spreader. Following the C4 mounting of the integrated circuit upon the substrate, the heat spreader is attached to the upper surface of the substrate such that the pins of the heat spreader extend into the holes of the substrate and the integrated circuit resides within the heat spreader cavity. The ends of the heat spreader pins are connected to bonding pads on the underside of the substrate, providing additional thermal paths for the dissipation of heat energy produced by the integrated circuit during operation.

The integrated circuit includes multiple electrical contacts (i.e., bonding or I/O pads) on an underside surface, preferably arranged in a two-dimensional array. The substrate includes a first set of electrical contacts (i.e., bonding pads) on an upper surface and a second set of bonding pads on an opposed underside surface. The first and second sets of bonding pads are preferably arranged in two-dimensional arrays. The lateral dimensions (i.e., sizes) of the I/O pads of the integrated circuit and members of the first set of bonding pads of the substrate are substantially equal, and the first set of bonding pads of the substrate are configured to vertically align with corresponding members of the I/O pads of the integrated circuit. The substrate also includes multiple layers of a patterned conductive material forming electrical conductors or "traces". The electrical traces connect members of the first and second sets of bonding pads.

A portion of the integrated circuit I/O pads and a corresponding portion of the first set of bonding pads of the substrate are preferably configured for heat transfer in order to assist in the removal of heat energy from the integrated circuit. Thermal vias connect members of the portion of the first set of bonding pads to a corresponding portion of the second set of bonding pads. When members of the second set of bonding pads are connected to a printed circuit board (PCB), heat energy produced by the integrated circuit flows through the thermal vias and into the PCB. The PCB functions as a heat sink, transferring the heat energy to the ambient. The thermal vias and the bonding pads connected thereto thus provide direct thermal paths for the dissipation of heat energy produced by the integrated circuit to the PCB.

During the C4 process, solder bumps covering the I/O pads of the integrated circuit are brought into contact with corresponding members of the first set of bonding pads. The solder bumps are then heated until they flow, connecting the I/O pads to the corresponding members of the first set of bonding pads. The substrate maintains its substantially planar shape during C4 heating.

The heat spreader is made from a thermally conductive and substantially rigid material. The heat spreader is preferably dimensioned to substantially cover the upper surface of the substrate. The cavity of the heat spreader is substantially in the center of the underside surface of the heat spreader. In one embodiment, the pins of the heat spreader are arranged about the periphery of the underside surface of the heat spreader. The periphery of the underside surface of the heat spreader is attached to the periphery of the upper surface of the substrate, preferably using a thermally conductive adhesive material.

Following the C4 process, the heat spreader is attached to the upper surface of the substrate such that the integrated circuit resides within the cavity of the heat spreader. A select quantity of a thermally conductive thermal interface material which flows under pressure (e.g., thermally conductive epoxy or thermal grease) is preferably deposited in the center of the backside, i.e., upper surface of the integrated circuit, and a thermally conductive adhesive material which flows under pressure is deposited about the perimeter of the upper surface of the substrate. The heat spreader is then positioned above the substrate and lowered until an upper wall of the cavity of the heat spreader contacts the thermal interface material upon the integrated circuit, and an underside surface of the heat spreader contacts the adhesive material. The pins of the heat spreader are inserted into the corresponding holes of the substrate. Sufficient downward pressure is applied to the upper surface of the heat spreader such that the thermal interface material spreads out between the upper surface of the integrated circuit and the adjacent portion of cavity wall to form a thermal interface layer therebetween. The thermal interface layer is preferably only a "bond line thickness" of the thermal interface material in order to reduce the thermal resistance between the integrated circuit and the heat spreader. The adhesive material deposited about the perimeter of the upper surface of the substrate spreads out to form an adhesive layer which helps attach the underside surface of the heat spreader to the upper surface of the substrate. Depending on the adhesive material used, the adhesive may be subjected to a curing process in order to form a strong bond between the heat spreader and the upper surface of the substrate.

Members of a portion of the second set of bonding pads of the substrate are configured to assist in the removal of heat from the integrated circuit. The ends of the heat spreader pins are each connected to at least one member of the portion of the second set of bonding pads by means of, for example, a metallic trace (e.g., a dog-bone shaped copper trace). The lateral dimensions of other members of the portion may be made larger than the corresponding dimensions of the remaining bonding pads in order to reduce the thermal resistances between members of the portion and the underside surface of the substrate. These measures promote a flow of heat energy from the integrated circuit to metallic traces of a PCB attached to the second set of bonding pads.

In an alternate embodiment, members of the portion of the second set of bonding pads are connected to a single thermally conductive (e.g., copper) trace, along with the ends of the heat spreader pins. The trace thermally couples the members of the portion of the second set of bonding pads to one another in a daisy-chained fashion. The trace also thermally couples the members of the portion of the second set of bonding pads to the heat spreader, and to the underside surface of the substrate, further promoting the flow of heat energy from the integrated circuit to the metallic traces of the attached PCB. dr

BRIEF DESCRIPTION OF THE DRAWINGS

Other objects and advantages of the invention will become apparent upon reading the following detailed description and upon reference to the accompanying drawings in which.

Figure 1:
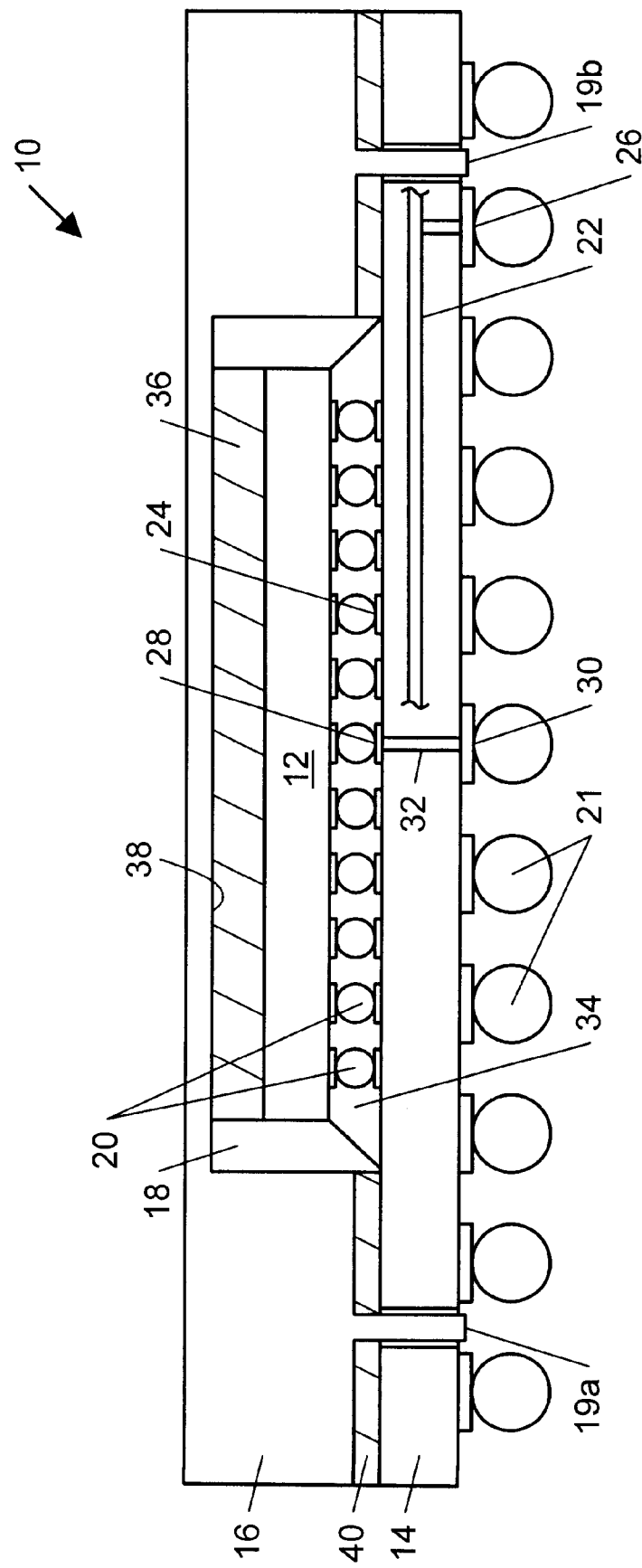
FIG. 1 is a cross-sectional view of one embodiment of a semiconductor device employing a grid array device package of the present invention, wherein the semiconductor device includes an integrated circuit (i.e., chip) mounted upon an upper surface of a substrate and a heat spreader covering the chip and attached to the substrate about the periphery of the chip, and wherein the chip resides within a cavity of the heat spreader, and wherein the heat spreader includes pins which extend into and through corresponding holes in the substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a cross-sectional view of one embodiment of a semiconductor device 10 employing a grid array device package of the present invention. Semiconductor device 10 includes an integrated circuit (i.e., chip) 12, a substrate 14, and a heat spreader 16. Substrate 14 has substantially planar and opposed upper and underside surfaces. Chip 12 is mounted upon the upper surface of substrate 14 using the controlled collapse chip connection (C4) or "flip chip" method described above. Heat spreader 16 includes an underside surface having a cavity 18 therein. Cavity 18 of heat spreader 16 is dimensioned to receive chip 12. Heat spreader 16 is formed from a thermally conductive material (e.g., a metal such as aluminum), and is preferably dimensioned to substantially cover the upper surface of substrate 14. Heat spreader 16 also includes multiple pins extending outwardly from the underside surface. In the embodiment described herein, heat spreader 16 includes four such pins arranged about the periphery of the underside surface of heat spreader 16. (See FIG. 2). Two of the four pins, labeled 19a–b, are shown in FIG. 1. Substrate 14 includes holes positioned and dimensioned to receive the pins of heat spreader 16. The pins of heat spreader 16 extend into and through the corresponding holes of substrate 14. The ends of the pins are connected to bonding pads on the underside of substrate 14 through metallic traces (e.g., dog-bone shaped copper traces), providing additional thermal paths for the dissipation of heat energy produced by chip 12 during operation. Semiconductor device 10 also includes other advanced heat transfer mechanisms.

Chip 12 includes one or more electronic devices formed upon a monolithic semiconductor substrate. Chip 12 also includes multiple I/O pads on an underside surface which function as device terminals. The I/O pads are preferably arranged in a two-dimensional array and covered with solder, forming solder bumps 20. Substrate 14 is preferably substantially fiberglass-epoxy printed circuit board material. Alternately, substrate 14 may substantially be, for example, a ceramic material (e.g., aluminum oxide or aluminum nitride). Substrate 14 includes two sets of bonding pads; a first set of bonding pads on an upper surface and a second set of bonding pads on an opposed underside surface. The first and second sets of bonding pads are preferably arranged in two-dimensional arrays. Members of the first set of bonding pads have substantially the same lateral dimensions (i.e., are approximately the same size) as the I/O pads of chip 12 and are configured to vertically align with the I/O pads of chip 12. The second set of bonding pads may be covered with solder, forming solder balls 21 as shown in FIG. 1 which function as terminals of semiconductor device 10. Alternately, the second set of bonding pads may have pins for connecting to a PCB or for inserting into a socket.

Substrate 14 also includes one or more patterned horizontal layers of electrically conductive material forming electrical conductors connecting members of the first and second sets of bonding pads. A layer of the dielectric material of substrate 14 (i.e., fiberglass-epoxy or ceramic material) separates adjacent horizontal conductive layers, electrically isolating the conductive layers. In FIG. 1, an exemplary horizontal trace conductor 22 connects a bonding pad 24 of the first set of bonding pads to a bonding pad 26 of the second set of bonding pads with the help of vertical conductive vias.

A portion of the I/O pads of chip 12 and a corresponding portion of the first set of bonding pads of substrate 14 are preferably configured for heat transfer in order to assist in the removal of heat energy from chip 12. Such I/O and bonding pads may or may not be used to conduct electrical energy or signals in addition to heat energy. Accordingly, there are various vias extending between the first and second bonding pads, a portion of which are connected solely to conduct thermal energy and another portion of which are connected to conductor primarily electrical energy but could also conduct thermal energy. The vias which are connected solely to conduct thermal energy are deemed "thermal vias". The vias which conduct electrical energy are trace conductors which might partially extend along a horizontal plane of the substrate. Thermal vias connect members of the portion of the first set of bonding pads to a corresponding portion of the second set of bonding pads. In FIG. 1, bonding pad 28 is a member of the portion of the first set of bonding pads configured to assist in the removal of heat energy from chip 12. Bonding pad 30 is a member of the corresponding portion of the second set of bonding pads configured to assist in the removal of heat energy from chip 12. A thermal via 32 connects bonding pad 28 directly to bonding pad 30. When solder balls 21 are connected to a printed circuit board (PCB), heat energy produced by chip 12 flows through bonding pad 28, thermal via 32, and bonding pad 30, and into the PCB. The PCB functions as a heat sink, transferring the heat energy to the ambient. Bonding pads 28 and 30, along with thermal via 32, thus provide an additional thermal path for the dissipation of heat energy produced by chip 12.

During the C4 mounting process, solder bumps 20 of chip 12 are vertically aligned over and brought into contact with corresponding members of the first set of bonding pads on the upper surface of substrate 14. Heat is then applied to solder bumps 20 to cause solder bumps 20 to flow, connecting I/O pads of chip 12 to the corresponding members of the first set of bonding pads. Substrate 14 maintains its substantially planar shape when exposed to maximum C4 temperatures of about 230 degrees Celsius.

Following the mounting of chip 12 upon the upper surface of substrate 14, the space formed between the underside of chip 12 and the corresponding portion of the upper surface of substrate 14 is filled with an underfill material 34. Underfill material 34 may be, for example, a liquid which hardens over time. The liquid may be initially dispensed along one or more sides of chip 12, using capillary action to fill the space between the underside of chip 12 and the corresponding portion of the upper surface of substrate 14. For example, underfill material 34 may be an epoxy compound including suspended particles of a thermally conductive and electrically insulating material (e.g., silica). A suitable epoxy compound is Dexter HYSOL® No. 4534, a silica-filled epoxy (Dexter Electronic Materials, Industry, Calif.). Underfill material 34 encapsulates the C4 connections and provides other mechanical advantages.

Figure 2:
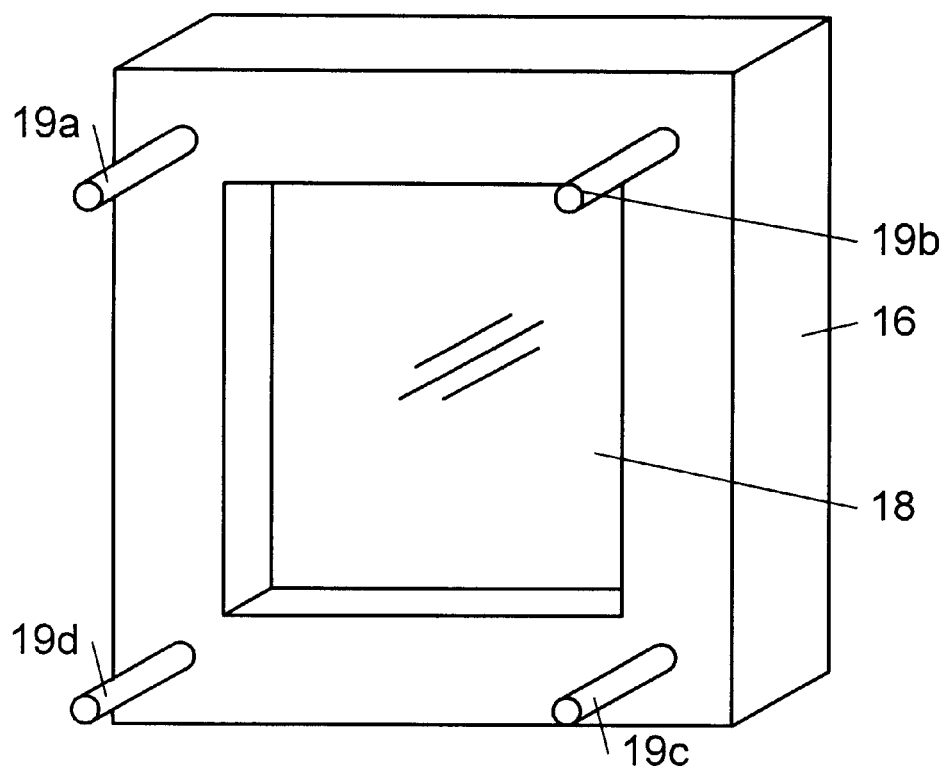
FIG. 2 is an isometric view of the underside surface of one embodiment of the heat spreader, wherein the heat spreader includes four pins arranged about the periphery of the underside surface and extending outwardly from the underside surface.

FIG. 2 is an isometric view of the underside surface of one embodiment of heat spreader 16. As described above, heat spreader 16 may include four pins 19a–d extending outwardly from the underside surface of heat spreader 16 and arranged about the periphery of the underside surface. Following the C4 process, heat spreader 16 is attached to the upper surface of substrate 14 such that chip 12 resides within cavity 18.

During attachment of heat spreader 16 to substrate 14, a thermal interface layer 36 is formed between the upper surface of chip 12 and an upper wall 38 of cavity 18 which thermally couples chip 12 to heat spreader 16, and the periphery of the underside surface of heat spreader 16 is attached to the periphery of the upper surface of substrate 14. A select quantity of a thermally conductive thermal interface material which flows under pressure (e.g., thermally conductive epoxy or thermal grease) is preferably deposited in the center of the upper surface of chip 12, and a thermally conductive adhesive material which flows under pressure is deposited about the perimeter of the upper surface of substrate 14. Heat spreader 16 is then positioned above substrate 14 and lowered until upper wall 38 of cavity 18 contacts the thermal interface material upon chip 12, and an underside surface of heat spreader 16 contacts the adhesive material. Pins 19a–d of heat spreader 16 are inserted into the corresponding holes of substrate 14. Sufficient downward pressure is applied to the upper surface of heat spreader 16 such that the thermal interface material spreads out between the upper surface of chip 12 and the adjacent portion of the upper wall 38 of cavity 18 to form thermal interface layer 36 therebetween. Thermal interface layer 36 is preferably only a "bond line thickness" of the thermal interface material in order to reduce the thermal resistance between chip 12 and heat spreader 16. As such, the vertical thickness of thermal interface layer 36 is between about 0.05 mm and approximately 0.08 mm. The adhesive material deposited about the perimeter of the upper surface of substrate 14 spreads out to form adhesive layer 40 which assists in attaching the underside surface of heat spreader 16 to the upper surface of substrate 14.

Thermal interface layer 36 may be, for example, a layer of a thermally conductive epoxy compound including particles of a thermally conductive material (e.g., silver, aluminum, boron nitride, etc.). A suitable epoxy is Abelstik No. 965-1L, a silver-filled epoxy (Abelstik Co., Rancho Dominguez, Calif.). Alternately, thermal interface layer 36 may be a layer of thermal grease, thermal wax, or a piece of thermal interface tape.

Adhesive layer 40 may be, for example, a layer of an epoxy including particles of a thermally conductive material (e.g., silver, aluminum, boron nitride, etc.). A suitable adhesive material is Abelstik No. 965-1L, a silver-filled epoxy (Abelstik Co., Rancho Dominguez, Calif.). Depending upon the type of adhesive material used, adhesive layer 40 may be subjected to a curing process in order to form a strong bond between the underside surface of heat spreader 16 and the upper surface of substrate 14.

Figure 3:
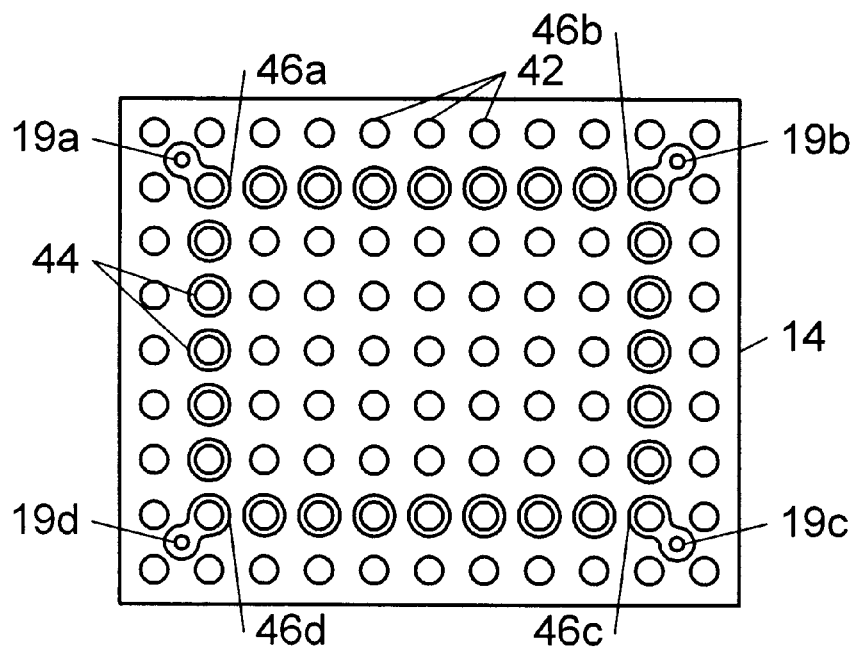
FIG. 3 is a plan view of the underside surface of one embodiment of the substrate, wherein a portion of the bonding pads upon the underside surface of the substrate are configured to assist in the removal of heat energy from the chip, and wherein the lateral dimensions of members of the portion are made larger than the corresponding dimensions of the remaining bonding pads in order to reduce the thermal resistances between the member bonding pads and the underside surface of the substrate, and wherein the end of each heat spreader pin is connected to a member of the portion of the second set of bonding pads by a dog-bone shaped metallic trace.

FIG. 3 is a plan view of the underside surface of one embodiment of substrate 14. Members of the second set of bonding pads 42 are shown prior to formation of solder balls 21 upon bonding pads 42. Bonding pads 44 are members of the portion of the second set of bonding pads configured to assist in the removal of heat energy from chip 12 as described above. The lateral dimensions of such members may be made larger than the lateral dimensions of the remaining bonding pads in order to reduce the thermal resistances between the member bonding pads and the underside surface of substrate 14. This may be accomplished by encircling the members with rings of a thermally conductive material (e.g., copper) connected to the bonding pads. The ends of pins 19a–d of heat spreader 16 are each connected to at least one member of the portion of the second set of bonding pads. In the embodiment of FIG. 3, the ends of pins 19a–d are each connected to a member of the portion of the second set of bonding pads by respective thermally conductive traces 46a–d (e.g., dog-bone shaped copper traces). Such connections may be made using solder or metallic (e.g., copper) plating, providing additional thermal paths from chip 12 of semiconductor device 10 to metallic traces of a PCB attached to bonding pads 42.

In a preferred embodiment, the side walls of the holes of substrate 14 are plated with a thermally conductive metallic material (e.g., copper), and the connecting of the ends of pins 19a–d to respective traces 46a–d involves substantially filling spaces between the pins and the plated side walls of the holes of substrate 14 with solder or metallic (e.g., copper) plating. Using this approach, the thermal resistances between heat spreader 16 and traces 46a–d are advantageously reduced.

Figure 4:
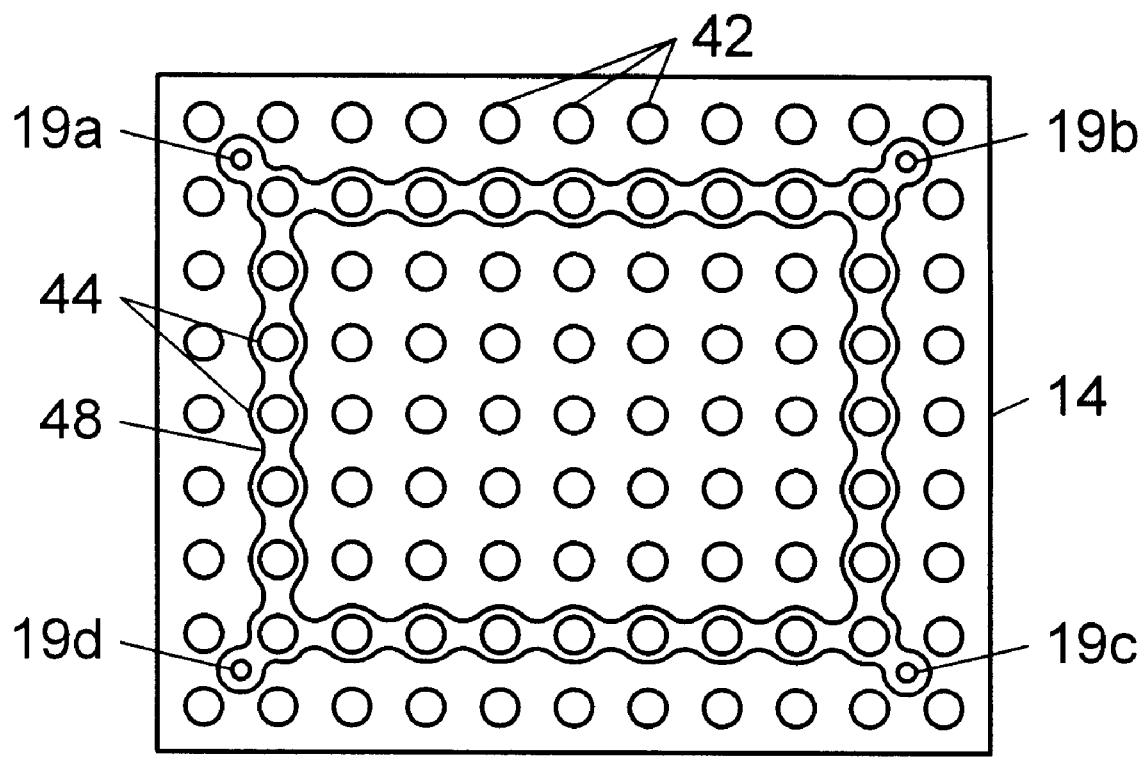
FIG. 4 is a plan view of the underside surface of an alternate embodiment of the substrate, wherein members of the portion of the bonding pads upon the underside surface of the substrate configured to assist in the removal of heat energy from the chip are connected to a single thermally conductive trace in a daisy-chained fashion along with the ends of heat spreader pins, further promoting the flow of heat energy from the integrated circuit to metallic traces of a PCB attached to the second set of bonding pads.

FIG. 4 is a plan view of the underside surface of an alternate embodiment of substrate 14. As in FIG. 3, members of the second set of bonding pads 42 are shown prior to formation of solder balls 21 upon bonding pads 42. Bonding pads 44, members of the portion of the second set of bonding pads configured to assist in the removal of heat energy from chip 12, are connected to a single thermally conductive (e.g., copper) trace 48. The ends of pins 19a–d of heat spreader 16 are also connected to thermally conductive trace 48. Trace 48 preferably forms a ring about the periphery of the underside surface of substrate 14 as shown in FIG. 4. Trace 48 thermally couples the members of the portion of the second set of bonding pads to one another, to heat spreader 16, and to the underside surface of substrate 14, providing additional thermal paths from chip 12 to metallic traces of a PCB attached to bonding pads 42.

Numerous variations and modifications will become apparent to those skilled in the art once the above disclosure is fully appreciated. It is intended that the following claims be interpreted to embrace all such variations and modifications.

What is claimed is:

1. A package intended for housing an integrated circuit, comprising:
    a substrate including a set of electrically conductive bonding pads upon a first surface, wherein said bonding pads are arranged to align vertically with and adapted for coupling to a set of input/output (I/O) pads of the integrated circuit; and
    a thermally conductive heat spreader comprising:
        a surface having a cavity formed therein inside a periphery of said surface, wherein said cavity is dimensioned to operably receive the integrated circuit; and
        a plurality of pins extending from the periphery of said surface as a unitary portion of said surface, wherein said pins are adapted for insertion into respective apertures within the substrate.

2. The package as recited in claim 1, wherein the set of input/output (I/O) pads extend across a surface of the integrated circuit, and wherein the substrate further comprises a plurality of dielectrically spaced conductors which terminate as the set of bonding pads.

3. The package as recited in claim 2, wherein an area occupied by each of said bonding pads is substantially equal to an area occupied by each of said I/O pads such that following coupling of the set of bonding pads to the set of I/O pads, the integrated circuit is retained upon said substrate.

4. The package as recited in claim 2, wherein said spaced conductors are patterned among a set of dielectrically spaced layers within said substrate.

5. The package as recited in claim 1, wherein the first surface of said substrate is substantially planar, and wherein said substrate further comprises a second substantially planar surface opposed to said first surface, and wherein said substrate retains said substantially planar, opposed first and second surfaces when exposed to maximum thermal energy of about 230 degrees C.

6. An assembly, comprising:
    a substrate having opposed upper and underside surfaces, wherein the substrate comprises:
        a first set of electrically conductive bonding pads arranged upon the upper surface of said substrate; and
        a plurality of holes extending between the upper and underside surfaces of the substrate;
    an integrated circuit having a plurality of input/output (I/O) pads arranged upon an underside surface of the integrated circuit, wherein the I/O pads are in coupled alignment with said first set of bonding pads; and
    a thermally conductive heat spreader attached to the substrate, wherein the heat spreader comprises:
        an underside surface having a cavity surrounded by a downward-extending surface, wherein the integrated circuit resides within the cavity; and
        a plurality of pins extending from the downward-extending surface as a unitary portion of said surface, wherein each of the plurality of pins extends into a corresponding one of the plurality of holes of the substrate.

7. The assembly as recited in claim 6, wherein members of said first set of bonding pads extend from a plurality of dielectrically spaced conductors encapsulated within the substrate.

8. The assembly as recited in claim 6, wherein said I/O pads are arranged directly over corresponding members of said first set of bonding pads.

9. The assembly as recited in claim 6, wherein said I/O pads are coupled to corresponding members of said first set of bonding pads with a plurality of respective solder bumps.

10. The assembly as recited in claim 9, wherein said plurality of solder bumps couple said I/O pads to corresponding members of said first set of bonding pads when heated.

11. The assembly as recited in claim 6, further comprising a thermal interface layer interposed between the integrated circuit and the heat spreader, wherein the thermal interface layer comprises a layer of a thermally conductive material.

12. The assembly as recited in claim 6, wherein a layer of a thermally conductive adhesive is used to attach the heat spreader to the substrate.

13. The assembly as recited in claim 6, wherein the substrate further comprises a second set of bonding pads arranged upon the underside surface, and wherein the assembly further comprises at least one thermal via connecting a member of the first set of bonding pads to a member of the second set of bonding pads.

14. The assembly as recited in claim 13, wherein the lateral dimensions of a portion of the second set of bonding pads are made larger than the remaining said second set of bonding pads in order to reduce the thermal resistance between the portion of the second set of bonding pads and the substrate, and wherein the ends of each of the plurality of pins of the heat spreader are connected to at least one member of the portion of the second set of bonding pads.

15. The assembly as recited in claim 14, wherein the assembly comprises a plurality of thermal vias, and wherein each of the plurality of thermal vias connects a member of the first set of bonding pads to a member of the portion of the second set of bonding pads.

16. The assembly as recited in claim 15, wherein the members of the portion of the second set of bonding pads are connected together.

* * * * *